United States Patent
Watarai

[19]

[11] Patent Number: 5,831,465
[45] Date of Patent: Nov. 3, 1998

[54] VARIABLE DELAY CIRCUIT

[75] Inventor: Seiichi Watarai, Tokyo, Japan

[73] Assignee: NEC Corporation, Tokyo, Japan

[21] Appl. No.: 829,009

[22] Filed: Mar. 31, 1997

[51] Int. Cl.⁶ .................................................. H03H 11/26
[52] U.S. Cl. ........................ 327/281; 327/276; 327/264; 327/288
[58] Field of Search .................... 327/264, 270, 327/271, 276, 277, 284, 288, 432, 433, 281

[56] References Cited

U.S. PATENT DOCUMENTS

| 4,473,762 | 9/1984 | Iwahashi et al. | |
|---|---|---|---|
| 5,121,014 | 6/1992 | Huang | 327/276 |
| 5,446,417 | 8/1995 | Korhonen et al. | 327/281 |
| 5,594,391 | 1/1997 | Yoshizawa | 327/264 |
| 5,684,423 | 11/1997 | Koyashiki et al. | 327/270 |
| 5,708,396 | 1/1998 | Mizuno | 327/264 |

FOREIGN PATENT DOCUMENTS 0 566 375 A1  10/1993  European Pat. Off. .
61-39721      2/1986   Japan .

Primary Examiner—Toan Tran

[57] ABSTRACT

A variable delay circuit for arbitrarily change of a signal delay helps easily attain a desired resolution with a high precision, which has been difficult due to device process dependence of a voltage control circuit applying a voltage to a CMOS circuit. A variable voltage controller is provided between a power source and a CMOS circuit propagating a signal such that a delay time of signal propagation is supervised by controlling the voltage at a connecting point in the variable voltage controller. The controller includes two MOS transistors and an npn transistor, which solves the process dependence and hence leads to a low power consumption and a high resolution.

6 Claims, 2 Drawing Sheets

VARIABLE DELAY CIRCUIT

BACKGROUND OF THE INVENTION

The present invention relates to a variable delay circuit capable of easily control delay time thereof.

DESCRIPTION OF THE RELATED ART

To control electronic and mechanical apparatuses including integrated circuits, there are generally employed electric control signals. The control signals of this kind are accompanied with components, so-called jitter signals, which vary with lapse of time along a time axis. To control the apparatuses above with a high precision, it is necessary to achieve a time-axis correction for the removal of jitter. The delay circuit is adopted for the time-axis correction. In this connection, for the variable delay circuits utilized with the recent integrated circuits, it is required to control quite a small amount of delay for a higher resolution.

In addition, since it is highly required to lower the the power consumption of the integrated circuits these days, there have been primarily adopted complementary metal-oxide semiconductor (CMOS) circuits in the variable delay circuits for the reduction of power consumption.

According to the Japanese Patent Laid-Open Ser. No. 61-39721, as shown in FIG. 1, there has been described an example of the conventional variable delay circuit proposed in relation to the requirements described above. In the variable delay circuit, a first transistor 21 and a second transistor 22 which are of a first conduction type (to be referred to as PMOS transistors herebelow) and a first transistor 23 and a second transistor 24 which are of a second conduction type (to be referred to as NMOS transistors herebelow) are linked with each other in a cascade connection.

The entire circuit configuration is connected between a first power source voltage VDD and a second power source voltage VSS. The second PMOS transistor 22 and first NMOS transistor 23 constitute an inverter in a CMOS configuration. The inverter includes a gate coupled with an input terminal VIN. The transistors 22 and 23 have source and drain regions connected to an output terminal VOUT. The first PMOS transistor 21 includes a gate connected to a first reference input terminal VR1 and the second NMOS transistor 24 includes a gate coupled with a second reference input terminal VR2.

In operation of the variable delay circuit, the input terminal VIN receives an input signal, whereas the output terminal VOUT produces an output signal. Furthermore, while the first reference input terminal VR1 is applied with a potential obtained by subtracting an arbitrary fixed potential VP from the first power source voltage VDD, the second reference input terminal VR2 is applied with a potential attained by adding the fixed potential VP to the second power source voltage VSS.

When the fixed potential VP is varied in the circuit, for example, when the value of VP is lowered, a potential of VDD−VP between the gate and source of the first PMOS transistor 21 is reduced. Additionally, a voltage of VSS+P between the gate and source of the second NMOS transistor 24 is also minimized. On this occasion, the so-called on resistance of each of the PMOS transistor 21 and NMOS transistor 24 becomes greater, which respectively control a current supplied from the first power source potential VDD via the PMOS transistor 22 to the output terminal VOUT and a current fed from the output terminal VOUT to the second power source potential VSS. In other words, a rising time of the output signal from the PMOS NMOS transistor 23 are respectively increased as variable delay values according to the change in the value of VP, thereby configuring a variable delay element.

In the variable delay circuit of the prior art, the voltage between the gate and source of the MOS transistor connected to the reference input terminal is varied to change the on resistance to resultantly alter the charge or discharge current for a load connected to the output terminal, thereby implementing a variable delay element. In this circuit structure, however, the resolution of the variable delay circuit is greatly influenced by the process dependence, leading to a problem that a high resolution cannot be attained.

That is, in the configuration of FIG. 1, the resolution is primarily determined by the arbitrary fixed potential assigned to the two reference input terminals VR1 and VR2 and the on resistance of the MOS transistor supervised by the fixed potential. The value of on resistance is represented as follows.

$$On\ resistance\ (RON) = [\beta \times (VGS - VT)] \quad (1)$$

$$\beta = \mu \times Cox \times (W/L)$$

where,

VGS=gate-source voltage of MOS transistor
VT=threshold voltage of MOS transistor
$\mu$=Mobility of MOS transistor
Cox=gate-channel capacitance per unitary volume
W=channel width of MOS transistor
L=channel length of MOS transistor In the expression above, the resolution which is the factor of variation in the on resistance is most related to the process dependence in the MOS transistor. In particular, two items of the process dependence are essential. First, the process dependence of channel length, namely, gate length L is to be considered. This is reduced as the process technology is improved. In general, the variation for gate length L ranging from 0.5 $\mu$m to 1.0 $\mu$m is ±10% to ±30%.

Second, the threshold voltage VT of the MOS transistor is to be taken into consideration. Like channel length L, the process dependence of threshold voltage Vt is minimized in relation to development of the process technology. Generally, the variation for threshold voltage VT ranging from 0.5 V to 1.0 V is ±25% to ±35%. Additionally, the process dependence of threshold voltage VT varies between the PMOS and NMOS transistors. Depending on cases, the dependence appears only in the PMOS or NMOS transistor, or the dependence of the PMOS transistor becomes opposite to that of the NMOS transistor.

Consequently, as can be appreciated from the numeric values above, the variable delay circuit of the prior art is highly related to the process dependence and hence it is quite difficult to attain a variable delay control amount according to the amount of variable delay operation of the reference input voltage. In addition, the the variable delay circuit of the conventional technology is required to possess a uniform resolution for the rising and falling of the output signal in association with the rising and falling of the input signal (or vice versa). However, the process dependence of the threshold voltage varies between the PMOS and NMOS transistors as described above. In the circuit of FIG. 1, the delay operation of the output signal rising edge is supervised by the PMOS transistor 22, whereas the delay operation of the output signal falling edge is controlled by the NMOS transistor 23. Therefore, when the process dependence of the PMOS transistor 22 is opposite to that of the NMOS transistor 23, the delay circuit is considerably influenced by the variable delay amount, which leads to a problem of quite a reduced resolution.

Furthermore, two reference input terminals are required to be supplied with two mutually different values of arbitrary fixed potential. Namely, two circuits are necessary for these reference voltages. In this situation, the area on which the reference output circuits are mounted and the power consumed by these circuits will be respectively at least doubled when compared with a case utilizing only one reference output circuit.

SUMMARY OF THE INVENTION

It is therefore an object of the present invention to provide a variable delay circuit capable of considerably reducing the process dependence.

To achieve the above object in accordance with the present invention, there is provided a variable delay circuit including a CMOS circuit including a MOS transistor of a first conduction type and a MOS transistor of a second conduction type. The CMOS circuit includes a gate connected to an input terminal and a source and a drain having a connection point therebetween, the connection point being connected to an output terminal. The source and the drain has respective terminals linked between a first power source and a second power source. The delay circuit further includes variable voltage control means inserted between the first power source and the CMOS circuit. The variable voltage control means includes two MOS transistors of the first conduction type of which sources and drains are connected to each other in a cascade and which are coupled between the first power source and the CMOS circuit and a bipolar transistor having a collector and an emitter connected between the first power source and the CMOS circuit in parallel with the MOS transistors of the first conduction type. The MOS transistor on a side of the first power source includes a gate linked with a reference input terminal and the MOS transistor on a side of the CMOS circuit includes a gate coupled with the second power source. The bipolar transistor includes a base connected to a connecting point between sources and drains of the MOS transistors.

Furthermore, in accordance with the present invention, the variable delay circuit includes first variable voltage control means between the CMOS circuit in the inverter configuration and the first power source and second variable voltage control means between the CMOS circuit and a second power source. Each control means including two MOS transistors and a bipolar transistor as described above.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring now the accompanying drawings, description will be given of an embodiment of the present invention.

Figure 1:
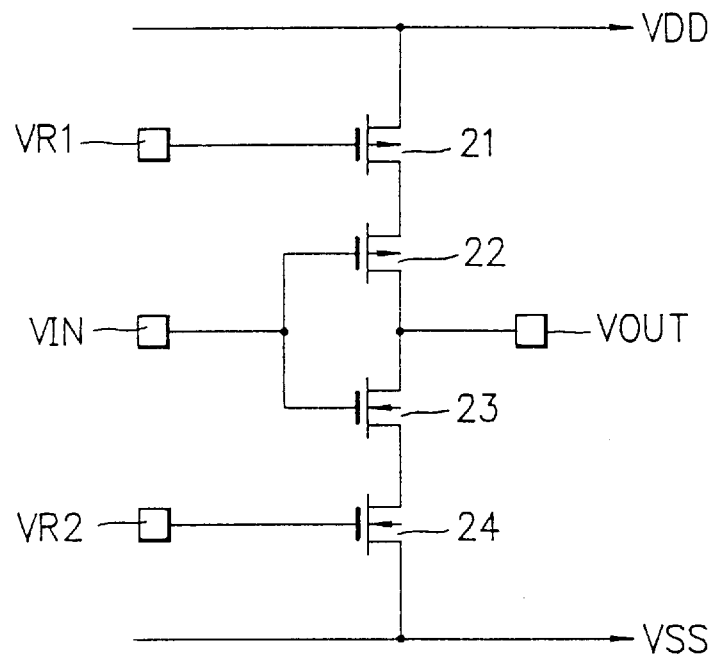
FIG. 1 is a diagram showing an example of the conventional variable delay circuit.
Figure 2:
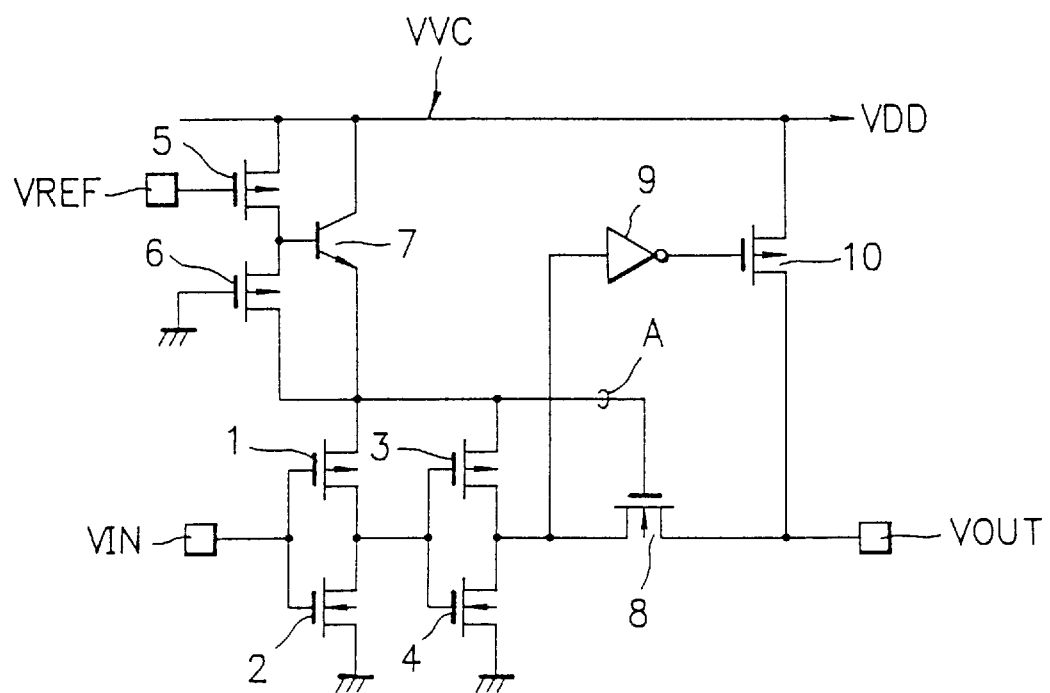
FIG. 2 is a schematic diagram showing the configuration of a first embodiment of the variable delay circuit in accordance with the present invention.

FIG. 2 shows in a circuit diagram the configuration of a first embodiment of the variable delay circuit in accordance with the present invention. As shown in this diagram, an inverter including two stages of CMOS circuits is arranged between an input terminal VIN and an output terminal VOUT. The CMOS circuit in a first stage includes a first PMOS transistor 1 and a first NMOS transistor 2 and the CMOS circuit in a second stage includes a second PMOS transistor 3 and a second NMOS transistor 4. In the construction, these CMOS circuits include respective sources and drains connected in a cascade to each other such that the sources respectively of the PMOS transistors 1 and 3 are connected to a connection point A serving as a contact between a variable voltage control circuit VVC and a first power source VDD, and the sources respectively of the NMOS transistors 2 and 4 are respectively linked with a second power source VSS (ground potential). Moreover, the gates respectively of the first PMOS and NMOS transistors 1 and 2 is coupled with the input terminal VIN. The source and drain respectively of the transistors 1 and 2 have end portions linked with gates respectively of the second PMOS and NMOS transistors 3 and 4. Moreover, the source and drain of the transistors 3 and 4 have end portions coupled to the output terminal VOUT via a fourth NMOS transistor 8.

The variable voltage controller VCC includes a third PMOS transistor 5 and a third NMOS transistor 6 of which sources and drains are connected in a cascade to each other and which is arranged between the first power source VDD and the connection point A. The controller VCC further includes a first npn bipolar transistor 7 of which a base is linked with a connecting point between the source and drain respectively of the transistors 5 and 6 and of which a collector and an emitter are coupled between the first power source VDD and the connection point A. Additionally, the third PMOS transistor 5 includes a gate connected to the reference input terminal VREF and the third NMOS transistor 6 has a gate linked with the second power source (ground) VSS.

Furthermore, the fourth NMOS transistor 8 includes a source and a drain which are arranged between an output end of the CMOS circuit in the second stage and the output terminal VOUT. The NMOS transistor 8 includes a gate coupled with the connection point A. The end terminal of the second-stage CMOS circuit is coupled with an inverter 9 connected to a fourth PMOS transistor 10 of which a source and a drain are disposed between the first power source VDD and the output terminal VOUT.

In the variable delay circuit, the variable delay element is obtained by changing the potential at connection point A, which can be controlled according to the change in the potential applied to the reference input terminal VREF. Assume that the potential at the connecting point A is dropped and the amount of potential drop is represented as VA. When the PMOS transistor 5 has an on resistance denoted as RP5, the PMOS transistor 6 has an on resistance designated as RP6, and the forward voltage between the base and the emitter of the npn transistor 7 is VF7, the potential drop VA appears relative to the power source potential VDD in the potential at connection point A as follows.

$$\text{Potential drop } (VA) = [(RP5/RP6)+1] \times VF7 \quad (2)$$

Assuming a potential of V1 is applied to the reference input terminal VREF, the following values of on resistance RP5 and RP6 are attained from expression (1).

$$\text{On resistance } (RP5) = [\beta \times (VDD - VTP - V1)] \quad (3)$$

$$\text{On resistance } (RP6) = [\beta \times (VDD - VTP)] \quad (4)$$

where, (VDD−V1)>VTP

VTP=threshold voltage of PMOS transistor.

Resultantly, the potential drop VA at connection point A is represented as follows.

$$VA = [[(VGP/(VGP-V1)] + 1] \quad (5)$$

$$VGP = VDD - VTP$$

In this connection, gate length L as an object of the process dependence in the conventional variable delay circuit is missing in expression (5). Moreover, the component of threshold voltage VT of PMOS transistor 5 is included in the denominator and numerator parts of expression (5) and hence the influences in these parts cancel each other. Consequently, the influence of the PMOS transistor 5 to the process dependence is ignorable. Namely, there is removed the influence exerted to the potential drop VA when obtaining the variable delay element. Incidentally, expression (5) includes forward voltage VF between the base and emitter of the npn transistor 7. However, the forward voltage is determined by such a substance as silicon employed as the basic material of the integrated circuit. The process dependence thereof is about 1/15 to 1/20 relative to that of the threshold voltage of the MOS transistor 6 and only a slight influence is exerted to voltage drop VA.

Next, description will be given of the control object of the variable delay element. In the configuration, the first-stage inverter includes the PMOS transistor 1 of which the source is linked with the connection point A and the NMOS transistor 2 paired therewith in a CMOS circuit. Similarly, the second-stage inverter includes the PMOS transistor 3 of which the source is coupled with the connection point A and the NMOS transistor 4 combined therewith in a CMOS structure.

The input terminal VIN is supplied from another circuit with an input signal having an amplitude of zero volt or the power source voltage VDD. However, since the source of PMOS transistor 1 is supplied with a potential of connecting point A which is obtained by subtracting a potential of VA from the power source voltage VDD, the output signal from the first-stage inverter has an amplitude of zero volt or the power source voltage VDD−VA. Similarly, in the second-stage inverter, since the source of PMOS transistor 3 is applied with the potential at the connection point A attained by subtracting a potential of VA from the power source potential VDD, the output signal from this inverter has an amplitude ranging from 0 volt to VDD−VA. However, the output signal from the fist-stage inverter is supplied to the second-stage inverter, namely, the input signal to the second-stage inverter has an amplitude of zero volt or VDD−VA.

The second-stage inverter is the control object of the variable delay circuit. Specifically, the delay time of the second-stage inverter is increased in association with the voltage drop of the gate voltage supplied to the gate thereof, the voltage drop VA is caused by the variable voltage controller VCC, namely, the power source voltage VDD is reduced to VDD−VA. Consequently, the greater the value of VA is, the longer the variable delay time becomes. The delay time can be attained by increasing the on resistance of the PMOS transistor 5. In short, the delay time is supervised by the voltage VREF applied to the gate of PMOS transistor 5.

In this regard, the configuration of the this embodiment includes only one reference input terminal VREF. Namely, a plurality of reference generator circuits which have been used in the prior art can be dispensed with. In addition, even when the process dependence of the PMOS transistor 5 is opposite to that of the NMOS transistor 6 with respect to the threshold voltage VT, the value of VA deciding the variable delay amount is independent thereof and is not influenced at all.

Moreover, the amplitude of the output signal from the second-stage inverter is VA less than VDD. Therefore, it is necessary to restore the amplitude to the original value of the signal supplied to the input terminal VIN, i.e., zero or VDD. This is achieved by the PMOS transistor 10 and the inverter 9. When the PMOS transistor 3 of the second-stage inverter is on, namely, the output level of the inverter is VDD−VA, the output signal from the inverter 9 is at the ground potential. In this situation, the PMOS transistor 10 turns on and the high-level potential at the output terminal OUT is boosted up to VDD.

The NMOS transistor 8 is provided to keep the output potential VDD−VA of the second-stage inverter when the high-level VDD is being outputted from the output terminal VOUT. In other words, the NMOS transistor prevents a leakage current from flowing from the output terminal voltage VDD at a high potential to the output terminal of the second-stage inverter at a low potential.

Figure 3:
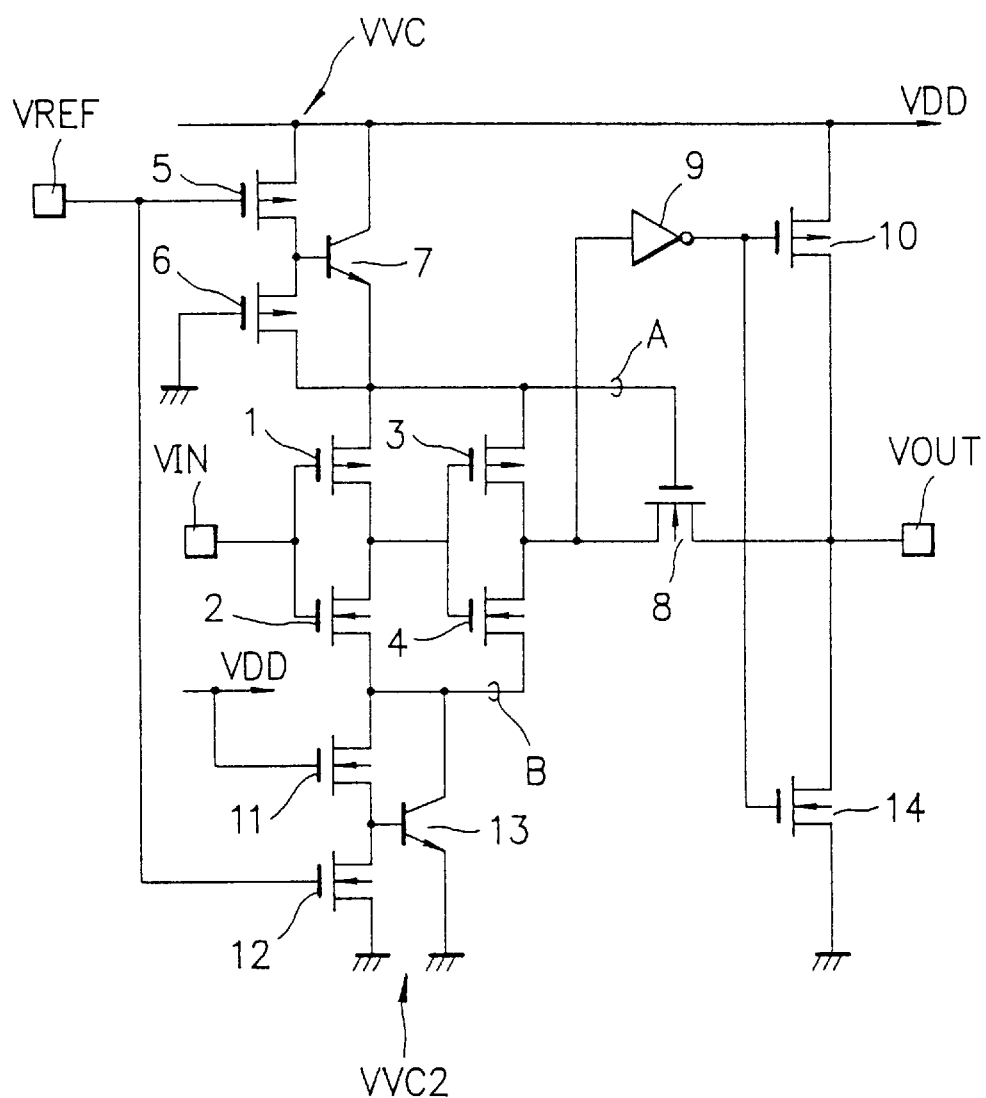
FIG. 3 is a diagram schematically showing the construction of a second embodiment of the variable delay circuit in accordance with the present invention.

FIG. 3 shows in a circuit diagram the configuration of the second embodiment of the variable delay circuit in accordance with the present invention. In the diagram, the same constituent elements as those of the first embodiment of FIG. 2 are assigned with the same reference numerals. Variable delay circuits are required to have a relatively high resolution depending on cases. In the second embodiment, the circuit is configured to meet the requirement for high resolution. In the configuration, n-channel MOS (NMOS) transistors 2 and 4 respectively included in CMOS circuits respectively of first and second stages possess sources linked with a connection point B. Coupled with a point between the connection point B and the second power source (ground) is a second variable voltage controller VVC2. The controller VVC2 is constructed in almost the same manner as for the variable voltage controller VVC of the first embodiment. Namely, there are included a fifth PMOS transistor 11 and a fifth NMOS transistor 12 of which sources and drains are linked with each other in a cascade and an npn transistor 13 of which a base is coupled with a connecting point between the pertinent source and drain of the transistors 11 and 12 and of which a collector and an emitter are linked with the connection point B and the second power source, respectively. Moreover, the fifth PMOS transistor 11 has a gate coupled with the first power source VDD and the fifth NMOS transistor 12 possesses a gate linked with the reference input terminal VREF. Additionally, the sixth NMOS transistor 14 includes a source and a drain linked to the output terminal VOUT and the second power soruce. The MOS transistor 14 has a gate connected to the output terminal of the inverter 9.

The variable delay circuit includes two variable delay elements. The first element is attained by varying the potential at the connection point A, which is analogous to the first embodiment. The second element is obtained by altering the potential at the connecting point B. The potential at each of the connecting points A and B can be supervised according to the change in the potential applied to the reference input terminal VREF. In this regard, the potential change, namely, the amount of variable delay operation is the same as that described in relation to the first embodiment.

Assume that when the potential at connection point A is lowered by VA, the potential at connection point B is increased by VB. A potential variation (reduction in potential) with respect to the power source potential VDD at the connection point B is then expressed as VA+VB. In this connection, as in the first embodiment, potential increase VB at point B is represented as follows.

$$\text{Potential increase } (VB)=[(RN11/RN12)+1]\times VF13 \quad (6)$$

Assume the potential applied to the reference input terminal VREF is indicated as V2. Then, on resistances RN11 and RB12 respectively of the PMOS and NMOS transistors 11 and 12 are expressed according to expression (1) as $$\text{On resistance } (RN11)=[\beta\times(VDD-VTN)] \quad (7)$$

$$\text{On resistance } (RN12)=[\beta\times(V2-VTN)] \quad (8)$$

where,
V2>VTN
VTN=threshold voltage of NMOS transistor.
In short, the potential increase at point B is designated as follows.

$$VB=[[(V2-VTN)/(VDD-VTN)]+1]\times VF13 \quad (9)$$

In this relationship, expression (9) does not include the gate length (channel length) as the object of the process dependence in the conventional variable delay circuit. Furthermore, the component of the threshold voltage of the NMOS transistor appears in the numerator and denominator of expression (9), and hence the influence is removed through cancellation taking place between the numerator and denominator. In addition, expression (9) includes the base-emitter forward voltage VF13 of the npn transistor 13. However, the voltage VF13 is determined by a substance used as the substrate of the integrated circuit. The process dependence thereof is about $\frac{1}{15}$ to $\frac{1}{20}$ of that of the threshold voltage of the MOS transistor and hence the influence thereof onto VA is minimized. This is the same as for the first embodiment.

That is, the influence to the process dependence of the NMOS transistor is ignorable, and the voltage increase VB for the variable delay element is not influenced. In the circuit configuration, the first-stage inverter includes the PMOS transistor 1 having a source linked with the connection point A and the NMOS transistor 2 used in pair with the PMOS transistor 1 in a CMOS circuit structure. Similarly, the second-stage inverter includes the PMOS transistor 3 having a source linked with the connection point A and the NMOS transistor 4 paired with the PMOS transistor 3 in a CMOS configuration. Supplied from another circuit to the input terminal VIN is an input signal having an amplitude ranging from zero volt to the power source voltage VDD. However, the output signal from the first-stage inverter has an amplitude which is reduced to the difference VDD-VA-VB between the points A and B. In a similar fashion, the output signal from the second-stage inverter has an amplitude lowered to VDD-VA-VB. Incidentally, the output signal from the first-stage inverter is supplied to the second-stage inverter, which has an amplitude of VDD-VA-VB.

The second-stage inverter is the control object of the variable delay circuit. Namely, the delay time thereof is increased according to the difference of reduction of the gate voltage by the voltage control means from the power source potential VDD to VDD-VA-VB. Therefore, the more VA+VB is, the longer the variable delay time becomes. The delay time is attained by increasing the on resistance values of the PMOS transistor 5 and the NMOS transistor 12. In other words, the delay time is supervised by the voltage VREF applied to the gates respectively of the transistors 5 and 12.

Like the first embodiment, the second embodiment includes only one reference input terminal. Consequently, a plurality of reference generator circuits required in the prior art can be dispensed with. Moreover, even when the process dependence of the PMOS transistor is opposite to that of the NMOS transistor in relation to the threshold voltage VT, the voltage VA deciding the variable delay amount is independent thereof and hence is not influenced.

Furthermore, the reference input VREF is applied with the same potential in the first and second embodiments. However, according to the second embodiment, the resolution is increased in relation to the change in potential VB at the connection point B. Namely, it is unnecessary to enlarge the range of reference potential in the circuit producing the reference potential.

Additionally, the amplitude of the output signal from the second-stage inverter has been lowered from VDD to VA+VB and hence it is necessary to restore the original amplitude of zero volt or VDD of the signal supplied to the input terminal VIN. This can be accomplished by the PMOS transistor 10, inverter 9, and NMOS transistor 14. When the PMOS transistor 3 of the second-stage inverter is on, namely, when the output level of the inverter is VDD-VA, the inverter 9 produces an output at the ground potential. In this situation, the PMOS transistor 10 and NMOS transistor 14 are respectively set to the on and off states and the high-level potential at output terminal VOUT is increased to VDD. When the low level of the output signal from the second-stage inverter is VB, the output from the inverter 9 is at the power source potential VDD. In this state, the PMOS transistor 10 and NMOS transistor 14 are respectively turned off and on and the low-level potential at output terminal VOUT is decreased to the ground potential.

In this regard, the NMOS transistor 8 is provided to keep the output potential VDD—VA of the second-state inverter when the output terminal OUT is producing a signal at high level VDD. Namely, this prevents a leakage of a current from the output terminal voltage at a high potential to the output terminal of second-stage inverter at a low potential.

In accordance with the present invention described above, the variable voltage control means is inserted between the first power source and the CMOS circuit in an inverter configuration disposed between the input and output terminals or between the CMOS circuit and the first and second power sources such that the voltage applied to the CMOS circuit is controlled by the variable voltage control means. As a result, it is possible to ignore the gate length dependence and threshold voltage dependence which are conspicuously related to the process dependence of the MOS transistor with respect to the variable voltage control means. Additionally, thanks to the utilization of stability of the forward voltage of the bipolar transistor in the variable voltage control means, the threshold voltage dependence thereof can be reduced to about $\frac{1}{15}$ to about $\frac{1}{20}$ of that of the prior art. This leads to a variable delay circuit having a high resolution.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:
1. A variable delay circuit comprising:
   a first delay generating circuit including a first MOS transistor of a first conduction type and a second MOS transistor of a second conduction type, the first delay generating circuit having a first input terminal connected to a gate of the first MOS transistor and a gate of the second MOS transistor, a first output terminal connected to a drain of the first MOS transistor and a drain of the second MOS transistor, a source of the first MOS transistor connected to a first variable voltage terminal, a source of the second MOS transistor connected to a second variable voltage terminal, the first input terminal further connected to a signal input terminal, and the first output terminal further connected to a signal output terminal; and a first variable voltage control means inserted between the first variable voltage terminal and a first power source, including third and fourth MOS transistors of the first conduction type and a first bipolar transistor, the third MOS transistor having its gate connected to a reference voltage input terminal and its source connected to the first power source, the fourth MOS transistor having its gate connected to a second power source and its drain connected to the first variable voltage terminal, and the first bipolar transistor having its base connected to the drain of the third MOS transistor and a source of the fourth MOS transistor, its collector connected to the first power source, and its emitter connected to the first variable voltage terminal, the second variable voltage terminal connected to the second power source.

2. A variable delay circuit as in claim 1, further comprising a second variable voltage control means inserted between the second variable voltage terminal and the second power source, including fifth and sixth MOS transistors of the second conduction type and a second bipolar transistor, the fifth MOS transistor having its gate connected to the reference voltage input terminal, and its source connected to the second power source, the sixth MOS transistor having its gate connected to the first power source, and its drain connected to the second variable voltage terminal, the second bipolar transistor having its base connected to the drain of the fifth MOS transistor and the source of the sixth MOS transistor, its collector connected to the second variable voltage terminal, and its emitter connected to the second power source.

3. A variable delay circuit as in claim 1, further comprising a seventh MOS transistor of the first conduction type, the seventh MOS transistor having its drain connected to the signal output terminal together with an input terminal of a first inverter (a first inversion logic circuit), its gate connected to an output terminal of the first inverter, and its source connected to the first power source.

4. A variable delay circuit as in claim 3, further comprising an eighth MOS transistor of the second conduction type, the eighth MOS transistor having its drain connected to the signal output terminal together with the drain of the seventh MOS transistor of the first conduction type and the input terminal of the first inverter (the first inversion logic circuit), its gate connected to the output terminal of the first inverter together with the gate of the seventh MOS transistor, and its source connected to the second power source while the source of the seventh MOS transistor is connected to the first power source.

5. A variable delay circuit as in claim 4, further comprising a second delay generating circuit, the second delay generating circuit inserted between the first output terminal of the first delay generating circuit and the signal output terminal, its first input terminal being connected to the first output terminal of the first delay generating circuit, and its first output terminal connected to the signal output terminal.

6. A variable delay circuit as in claim 5, further comprising a ninth MOS transistor of the second conduction type, the ninth MOS transistor having its source and drain between the signal output terminal and the first output terminal of the second delay generating circuit, its source being connected to the signal output terminal, its drain connected to the output terminal of the second delay generating circuit, and its gate connected to the first variable voltage terminal.

* * * * *